United States Patent
Schubert et al.

(10) Patent No.: US 11,455,443 B1
(45) Date of Patent: Sep. 27, 2022

(54) METHODS AND SYSTEMS FOR DESIGNING IMAGE PROCESSING DEVICES

(71) Applicant: X Development LLC, Mountain View, CA (US)

(72) Inventors: Martin Friedrich Schubert, Mountain View, CA (US); Brian John Adolf, San Mateo, CA (US); Jesse Lu, East Palo Alto, CA (US)

(73) Assignee: X Development LLC, Mountain View, CA (US)

( * ) Notice: Subject to any disclaimer, the term of this patent is extended or adjusted under 35 U.S.C. 154(b) by 595 days.

(21) Appl. No.: 16/555,419

(22) Filed: Aug. 29, 2019

(51) Int. Cl.
| | | |
|---|---|---|
| *G06F 30/23* | (2020.01) | |
| *G06T 3/40* | (2006.01) | |
| *G06T 5/00* | (2006.01) | |
| *G06N 3/08* | (2006.01) | |
| *G06F 30/39* | (2020.01) | |

(52) U.S. Cl.
CPC ........... *G06F 30/23* (2020.01); *G06F 30/39* (2020.01); *G06N 3/08* (2013.01); *G06T 3/4015* (2013.01); *G06T 5/002* (2013.01); *G06T 5/003* (2013.01)

(58) Field of Classification Search
CPC .......... G06F 30/23; G06F 30/39; G06N 3/08; G06T 3/4015; G06T 5/002; G06T 5/003
USPC .......................................................... 703/2
See application file for complete search history.

(56) References Cited

U.S. PATENT DOCUMENTS

| | | |
|---|---|---|
| 6,356,681 B1 | 3/2002 | Chen |
| 6,408,119 B1 | 6/2002 | Meltz et al. |
| 6,456,762 B1 | 9/2002 | Nishiki |
| 6,477,194 B1 | 11/2002 | Eng |
| 6,681,067 B1 | 1/2004 | Kersey |
| 6,768,850 B2 | 7/2004 | Dugan et al. |
| 6,847,762 B2 | 1/2005 | Sweetser et al. |
| 6,946,684 B2 | 9/2005 | Shigihara |
| 6,956,994 B2 | 10/2005 | Bernard |
| 8,380,027 B2 | 2/2013 | Reed |
| 10,592,732 B1 | 3/2020 | Sather et al. |

(Continued)

OTHER PUBLICATIONS

Sitzmann_2018 (End-to-end Optimization of Optics and Image Processing for Achromatic Extended Depth of Field and Super-resolution Imaging, ACM Trans. Graph., vol. 37, No. 4 Aug. 2018) (Year: 2018).*

(Continued)

*Primary Examiner* — Brian S Cook
(74) *Attorney, Agent, or Firm* — Fish & Richardson P.C.

(57) ABSTRACT

A computer-implemented method for designing an image processing device includes defining a loss function within a simulation space composed of a plurality of voxels; defining an initial structure for one or more physical features of a metasurface and one or more architectural features of a neural network in the simulation space; determining, using a computer system, values for at least one structural parameter, and/or at least one functional parameter for the one or more physical features and at least one architectural parameter for the one or more architectural features, using a numerical solver to solve Maxwell's equations so that a loss determined according to the loss function is within a threshold loss; defining a final structure of the metasurface based on the values for the one or more structural parameters; and defining a final structure of the neural network based on the values for the at least one architectural parameter.

20 Claims, 5 Drawing Sheets

(56) References Cited

U.S. PATENT DOCUMENTS

| | | |
|---|---|---|
| 2003/0186142 A1 | 10/2003 | Deshmukh et al. |
| 2004/0028104 A1 | 2/2004 | Buda |
| 2004/0196884 A1 | 10/2004 | Ohkubo |
| 2005/0226558 A1 | 10/2005 | Kim et al. |
| 2006/0078258 A1 | 4/2006 | Anisimov et al. |
| 2008/0013581 A1 | 1/2008 | Kobayashi |
| 2008/0089374 A1 | 4/2008 | Eichler |
| 2011/0102799 A1 | 5/2011 | Matejka et al. |
| 2016/0012176 A1 | 1/2016 | Liu et al. |
| 2016/0164260 A1 | 6/2016 | Chua |
| 2017/0179680 A1 | 6/2017 | Mahgerefteh |
| 2018/0024297 A1 | 1/2018 | Bovington et al. |
| 2018/0045953 A1 | 2/2018 | Fan et al. |
| 2018/0053334 A1 | 2/2018 | Schneider |
| 2020/0050715 A1 | 2/2020 | Krishnannurthy et al. |
| 2020/0226221 A1 | 7/2020 | Lu et al. |
| 2021/0305767 A1 | 10/2021 | Schubert et al. |

OTHER PUBLICATIONS

Mauricio_2021 (Design Framework for metasurface optics-based convolutional neural networks, vol. 60, No. 15/May 20, 2021 /Applied Optics) (Year: 2021).*

Molesky_2018 (Inverse Design in Nanophotonics, Nature Phtonics vol. 12 Nov. 2018 pp. 659-670) (Year: 2018).*

Bernhardi, "Fourteen Philosophy Thesis Topic Ideas for University Students," Dissertation for the degree of Doctor University of Twente, Integrated Optical MicroSystems (IOMS) group, Faculty of Electrical Engineering, Mathematics and Computer Science, MESA+ Institute for Nanotechnology, Apr. 1982, 169 pages.

Frei et al., "Topology optimization of a photonic crystal waveguide termination to maximize directional emission," Appl. Phys. Lett. 86, Mar. 2005, 86:111114.

Udupa et al., "Voxelized Topology Optimization for Fabrication Compatible Inverse Design of 3D Photonic Devices," Optics Express, Jul. 2019, 27(15):21988-21998.

Yin, "Photonic Inverse Design for 3-D Structures and Optical Phase Change Materials," Massachusetts Institute of Technology, Jun. 2019, 85 pages.

Chandler, "New system allows optical "deep learning"," Jun. 2017, retrieved on Oct. 9, 2018, retrieved from URL <http://news.mit.edu/2017/new-system-allows-optical-deep-learning-0612>, 3 pages.

Lee et al., "Metasurface eyepiece for augmented reality," Nature Communications, Nov. 2018, 10 pages.

Molesky, "Outlook for inverse design in nanophotonics," https://arxiv.org/abs/1801.06715, Jan. 2018, 13 pages.

Piggott et al., "Fabrication-constrained nanophotonic inverse design," Scientific Reports, May 2017, 7 pages.

Piggott et al., "Supplementary Information: Fabrication-constrained nanophotonic inverse design," retrieved from URL <https://static-content.springer.com/esm/art%3A10.1038%2Fs41598-017-01939-2/MediaObjects/41598_2017_1939_MOESM2_ESM.pdf>, May 2017, 10 pages.

Tahersima et al., "Deep Neural Network Inverse Design of Integrated Nanophotonic Devices," https://arxiv.org/abs/1809.03555, Sep. 2018, 8 pages.

Borel et al., "Topology optimization and fabrication of photonic crystal structures," Optics Express, May 2004, 12(9):6 pages.

Boutanni et al., "Efficient pixel-by-pixel optimization of photonic devices utilizing the Dyson's equation in a Green's function formalism: Part II. Implementation using standard electromagnetic solvers," Journal of the Optical Society of America, Sep. 2019, 36(9)2387-2394.

Molesky et al., "Inverse design in nanophotonics," Nature Photonics, Nov. 2018, 12:659-670.

Piggot, "Automated Design of Puotonic Devices," Dissertation for the degree of Doctor of Philosophy, Stanford University, Department of Electrical Engineering, Jun. 2018, 114 pages.

Xu et al., "Navigating through complex photonic design space using machine learning methods," SPIE Optics + Optoelectronics, Apr. 2019, 11031:110310S-1.

Yu et al., "Inverse-Design-based Light Via for Multi-Layer Photonic Integration Circuit," 2018 Asia Communications and Photonics Conference, 2018, 3 pages.

Damask, "Integrated-Optic Grating-Based Filters for Optical Communications Systems," Thesis for the degree of Doctor of Philosophy, Massachusetts Institute of Technology, May 6, 1996, 282 pages.

Winick et al., "Design of Grating-Assisted Waveguide Couplers with Weighted Coupling," Journal of Lightwave Technology, Nov. 1991, 9(11):1481-1491.

* cited by examiner

METHODS AND SYSTEMS FOR DESIGNING IMAGE PROCESSING DEVICES

TECHNICAL FIELD

This disclosure generally relates to image processing devices. The disclosure also generally relates to artificial neural networks for performing image enhancement and/or restoration.

BACKGROUND

Imaging sensors detect and convey the information used to make an image. Imaging sensors convert the variable attenuation of light waves into signals (e.g., small bursts of current that convey information). Typical imaging sensors include semiconductor charge-coupled devices (CCD) and active photo-sensors (e.g., pixel sensors, photodiodes, etc.) in complementary metal-oxide-semiconductor (CMOS) or N-type metal-oxide-semiconductor (NMOS) technologies. Many imaging sensors include an array of photo-sensors (e.g., photodiodes) for receiving light, which is converted to an electrical current. Furthermore, imaging sensors usually include analog-to-digital converters for converting the electrical current from the photo-sensors to a digital signal. Filters, such as color filter arrays, are normally placed over the photo-sensors to capture color information. Color filters can be important because conventional photo-sensors detect light intensity with little or no wavelength specificity, and therefore cannot separate color information.

Because the color filter array can output incomplete color samples, many image sensor pipelines include digital image processing means to reconstruct a full color image from the incomplete color samples. For example, demosaicing algorithms can be used to render these images into a viewable format. Recently, it is becoming popular to exploit the machine learning techniques of artificial neural networks to enhance the resolution of images by performing, for example, demosaicing and super-resolution techniques.

SUMMARY

Typical color filter arrays include a 2×2 color array having one red filter, one blue filter, and two green filters. This pattern is commonly known as the Bayer pattern. Each photo-sensor of an imaging sensor's photo-sensor array is covered by one of the color filters. Therefore, each photo-sensor is configured to capture light associated with one of the three colors used. Sometimes, each photo-sensor is referred to as a pixel. However, sometimes an RGGB block of photo-sensors is referred to as a pixel. For the purposes of this disclosure, a pixel refers to each photo-sensor of the imaging sensor's photo-sensor array. The use of conventional RGGB filters can be inefficient because they essentially throw away approximately $2/3^{rd}$ of available photons, and thus a substantial portion of available light information is not captured by the imaging sensor.

This disclosure relates to methods of designing optical metasurfaces and demosaicing algorithms for image capture and reconstruction. The method seeks to solve, among other things, the aforementioned disadvantages regarding the inefficiencies of using typical RGGB color filters in image capture devices. The color filter array can be replaced by a metasurface that substantially transmits all incident light, or at least considerably more light than conventional RGGB filters, while scattering the transmitted light to one or more photo-sensors based on the light's wavelength. The metasurface can be co-optimized with a neural network system that transforms the response of the imaging sensor's photo-sensor array into a full color image.

The method utilizes a computational inverse design tool that involves first defining a loss function characteristic of the output of a digital neural network. The neural network's input corresponds with a pixel array covered by the metasurface. The loss function can include a signal to noise ratio or other image quality metrics (e.g., how much each color is missing, amount of blur, etc.). The design tool co-optimizes the structure of the metasurface, and the neural network, to minimize the loss function.

To optimize the metasurface, the metasurface is broken down into voxels. The interaction between the metasurface and a full spectrum illumination can be simulated by numerically solving Maxwell's equations at each voxel and interactions between each voxel and its neighboring voxels. For each voxel of the metasurface, the materials (e.g., metal and dielectric nanostructures) and optical features (e.g., curvatures, openings, antennas, etc.) of the metasurface can be determined such that they will lead to an optimal placement of light to minimize the loss function. For each simulated metasurface design (e.g., for each voxel change), the method also includes co-optimizing the design of a neural network such that a demosaicing algorithm is also optimized to minimize the loss function. Consequently, for each incremental change in the metasurface during the optimization process, the tool also optimizes the neural network algorithm. Thus, the tool can co-design a metasurface and a machine learning algorithm that will minimize image loss by preserving photons and optimizing image reconstruction using the preserved photons The loss function can also account for other considerations, including manufacturing penalties, where the tool accounts for the feasibility of the optimized design. For example, it might not be feasible to manufacture alternative voxels associated with the metasurface using different materials, and thus a penalty condition specifying an amount of voxels that should have the same materials can be used. The loss function can also take into account manufacturing costs and/or materials available.

In at least one aspect of the present disclosure, a method for designing an image processing device including at least one metasurface having one or more physical features and a neural network having one or more architecture features configured to perform image reconstruction is provided. The method includes defining a loss function within a simulation space composed of a plurality of voxels, the simulation space encompassing the one or more features of the metasurface and the one or more architecture features of the neural network. The loss function corresponding to at least one image quality metric results from: an interaction between an input electromagnetic field at an operative wavelength of the image processing device and the one or more physical features of the metasurface; and processing, by the neural network, the result of the interaction between the input electromagnetic field and the one or more features of the metasurface. The method includes defining an initial structure for the one or more physical features of the metasurface and the one or more architectural features of the neural network in the simulation space, at least some of the voxels corresponding to each of the one or more physical features and having a dimension smaller than the operative wavelength. The method includes determining, using a computer system, values for at least one structural parameter, and/or at least one functional parameter for the one or more physical features, and at least one architectural parameter for the one or more architectural features, using a numerical solver to solve Maxwell's equations so that a loss determined according to the loss function is within a threshold loss, in which the at least one structural and/or functional parameter correspond to a structure of the metasurface, and in which the at least one architectural parameter corresponds to a structure of the neural network. The method includes defining a final structure of the metasurface based on the values for the one or more structural parameters. The method includes defining a final structure of the neural network based on the values for the at least one architectural parameter.

The physical features can include at least one of: a nanostructure, a curvature, a hole, or an antenna. The neural network can include one or more architecture features configured to perform demosaicing. The one or more architecture features can include at least one of: a weight or a bias.

The at least one image quality metric can include at least one of: a signal-to-noise ratio, an amount of blur, a pixel loss value, or a resolution value. The loss function corresponding to at least one image quality metric can further result from converting the result of the interaction between the input electromagnetic field and the one or more features of the metasurface.

The at least one structural parameter can include at least one of: a curvature angle, a curvature size, or a size of an opening. The at least one functional parameter can include at least one of: a refractive index, a reflection angle, a diffraction angle, or a transmissivity value.

The at least one architectural parameter can include at least one of an accuracy value, a layer type, or a demosaicing type. The numerical solver can include a finite-difference time domain solver.

These and other aspects, features, and implementations can be expressed as methods, apparatus, systems, computer storage storing executable computer instructions, components, program products, methods of doing business, means or steps for performing a function, and in other ways, and will become apparent from the following descriptions, including the claims.

DETAILED DESCRIPTION

Figure 1A:
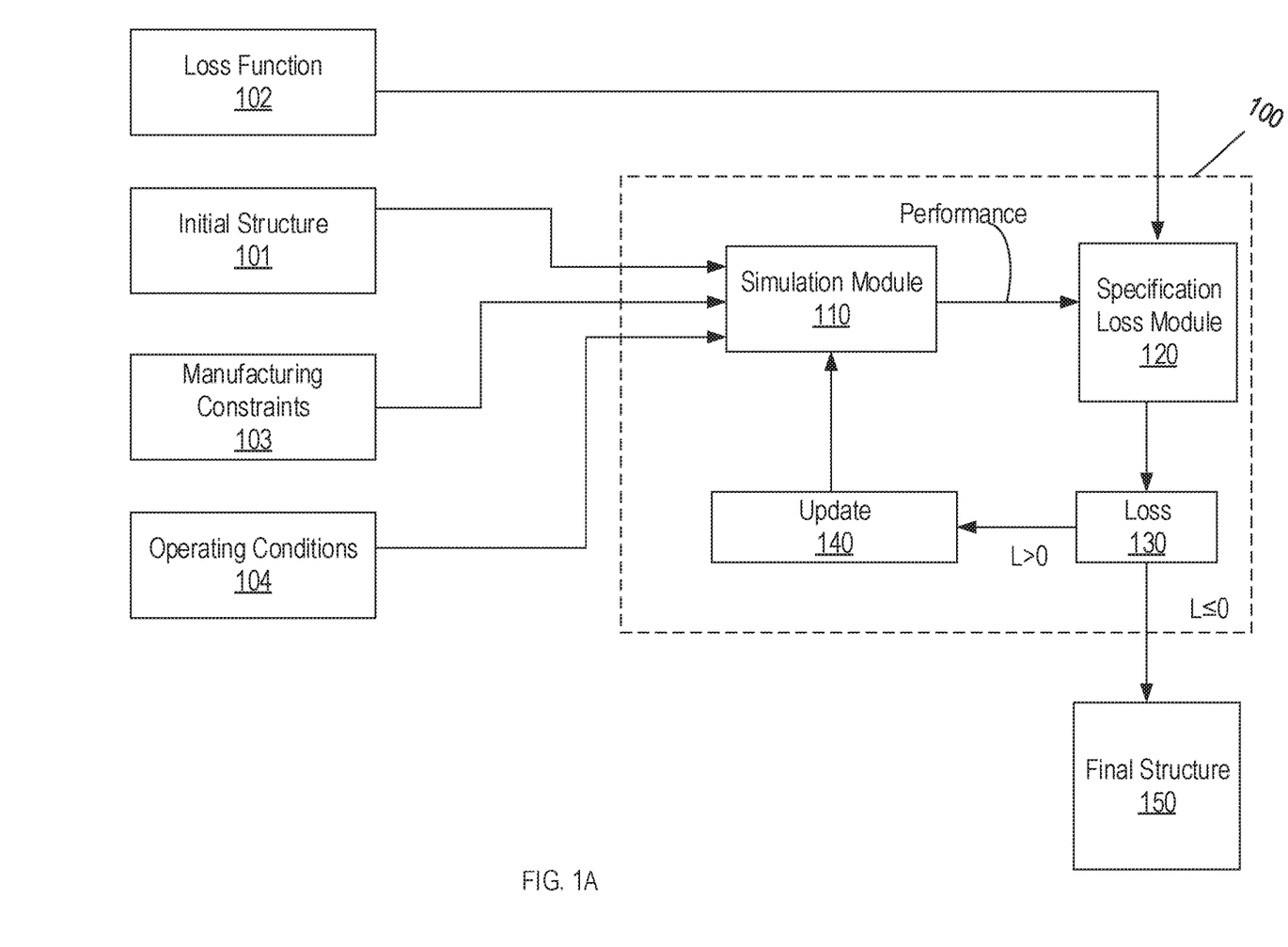
FIG. 1A shows an architecture for a computational inverse design tool that uses a simulation module and a specification loss module to iteratively simulate the performance of an optical device and determine a loss for the device.
Figure 1B:
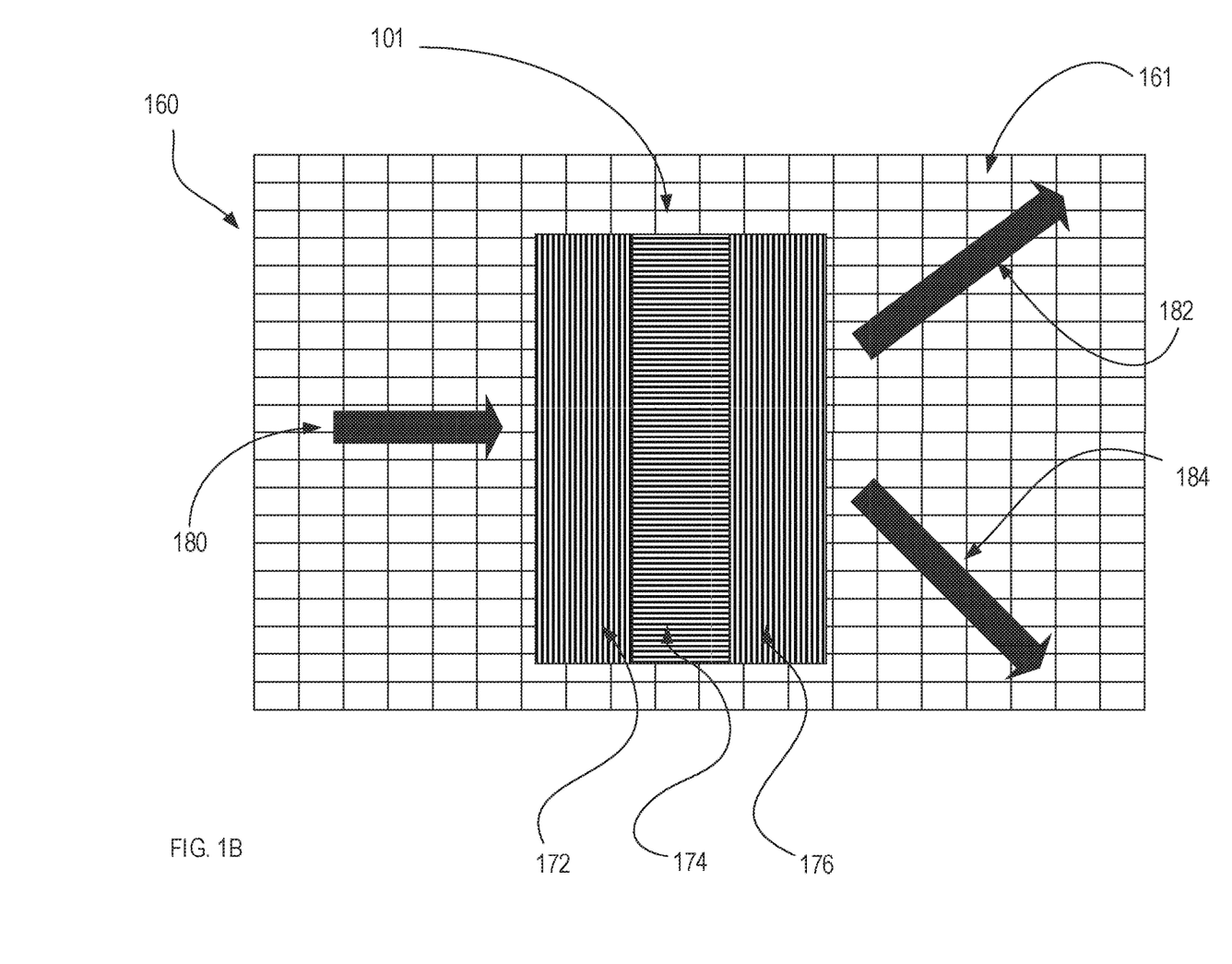
FIG. 1B shows an initial structure for a beam splitter as defined within a simulation space.

Referring to FIGS. 1A-1B, the structure of an image processing device is determined using a design tool 100, which refers to a computational engine that determines a design for the optical device that satisfies pre-specified performance criteria which, in this case, can be a target pixel loss value and/or a signal-to-noise ratio of an output of the image processing device. Such an approach to design is referred to as "inverse design" and the computational engine for solving such problems is referred to as an "inverse design tool."

In certain implementations, the inverse design problem involves having a designer specify the performance criteria for the optical device in terms of a "loss function," L (also sometimes referred to a "cost function"), which represents a variation of the performance of a given design for the optical device from the specified performance. When L is below a specified threshold, e.g., $L \leq 0$, for a given design, it signifies that the specified performance has been met. By appropriately defining the loss, the inverse problem can therefore be expressed as finding a design, z, for the optical device which satisfies $L \leq 0$.

Inverse design problems can be solved computationally through a combination of a simulation module and a loss module. The simulation module is used to mathematically model a physical system incorporating a given design for the optical device using equations that describe the physical properties of the physical system, such as Maxwell's equations. The simulation module can also mathematically account for constraints involved in manufacturing (e.g., structure sizes and shapes and material properties) and operating the device (e.g., thermal effects). The loss module determines the loss for a particular design, effectively evaluating the performance of the device compared to the desired performance.

FIG. 1A shows an architecture for a computational inverse design tool 100 that uses a simulation module 110 and a loss module 120 to iteratively simulate the performance of an optical device and determine a loss 130 for the device. Depending on whether the loss exceeds (e.g., $L>0$) or meets (e.g., $L \leq 0$) a specified threshold value, the design tool can either update (140) a structure of the device or produces a final structure 150 for the device.

The design tool 100 uses a number of input parameters from a user in order to determine a final structure for the device. These include an initial structure 101 for the optical device, a loss function 102, manufacturing constraints 103 and operating conditions 104. Initial structure 101 generally includes a starting point for the composition and dimensions for the optical device. Loss function 102 is based on the desired performance of the optical device and is typically defined by a desired electric field profile. In many cases, the desired electric field profile corresponds to an electric field output by the optical device in response to a particular input or inputs. Manufacturing constraints 103 incorporate constraints based on practical manufacturing considerations. For example, manufacturing constraints can be associated with an amount of spacing between components, size of one or more components (e.g., size in one dimension, e.g., width, and/or overall size, e.g., volume), radius of curvature of one or more components, maximum cost of potential materials, availability of potential materials, and so forth. Operating conditions 104 account for other physical properties of the system, such as sources or sinks of electromagnetic fields, operating temperature, etc.

Before discussing the application of the inverse design tool to image processing devices, it is instructive to consider the example of a simple beam splitter. FIG. 1B shows an initial structure for a beam splitter as defined within a simulation space. Referring also to FIG. 1B, generally, initial structure 101 of the optical device is defined within a simulation space 160 composed of voxels 161. Voxels are three-dimensional volume elements at which physical properties (e.g., refractive index, field values, and temperature) can be defined and/or calculated. Each voxel 161 can be sub-wavelength (e.g., 0.5λ or less, 0.2λ or less, 0.1λ or less, 0.05λ or less) for a particular wavelength of interest in at least one dimension. In many cases, voxels are sub-wavelength in three dimensions.

As illustrated, initial structure 101 is composed of three regions 172, 174, and 176 each composed of a different material. Each extends across multiple voxels. Arrow 180 represents an input electromagnetic field incident on one side of initial structure 101. This field is a component of operating conditions 104, input into the simulation module 110. Arrows 182 and 184 represent the desired performance (e.g., the desired electric field profile output by the optical device in response to the input electromagnetic field) of the optical device and the loss can be established as a difference, on a voxel by voxel basis, between the electromagnetic field represented by these arrows and the electromagnetic field that results from the interaction between the input electromagnetic field and initial structure 101.

Referring again to FIG. 1A, simulation module 110 determines the performance of the optical device using a differentiable solver for Maxwell's equations to model electromagnetic fields resulting from the one or more sources interacting with the structure defined for the optical device. In one form, Maxwell's equations can be expressed as:

$$\frac{\partial H}{\partial t} = -\frac{1}{\mu}(\nabla \times E - M_{source});$$

and $$\frac{\partial E}{\partial t} = \frac{1}{\varepsilon}(\nabla \times H - J_{source}),$$

where E and H represent electric and magnetic fields, ε and μ represent permittivity and permeability of the material at each voxel, and $J_{source}$ and $M_{source}$ are electric and magnetic currents. Numerical solution of Maxwell's equations yields electric and magnetic field values at each voxel, from which design tool 100 can calculate loss 130 for each voxel using loss module 120.

In some embodiments, a finite difference time domain (FDTD) approach is used to solve Maxwell's equations. Details of such an approach can be found, for example, in *Computational Electrodynamics: the Finite-Difference Time-Domain Method*, Third Edition, by A. Taflove and S. C. Hagness (Artech House, 2005). Such an approach involves updating values of the electric and magnetic fields at each voxel through a series of incremental time steps. Mathematically, this update operation can be expressed by a function ϕ, where:

$$x_{i+1} = \phi(x_i, b_i, z)$$

for i=1, . . . , n. Here, n is the total number of time steps for the simulation, $x_i$ refers to the electric and magnetic fields at time step i, $b_i$ represents electric and magnetic sources at time step i, and z is a structural variable, corresponding to the topology of the optical device. Additionally, the loss operation can be expressed as $L=f(x_1, \ldots, x_n)$ and takes as input all the computed fields and produces a single, real-valued scalar that can be minimized.

In such implementations, inverse design tool 100 can optimize a structure for the optical device (i.e., final structure 150 in FIG. 1A) based on a structural gradient $$\frac{\partial L}{\partial z}$$

according to the formalism above. This structural gradient can be determined according to the relationship:

$$\frac{dL}{dz} = \sum_i \frac{\partial L}{\partial x_i} \frac{\partial x_i}{\partial z}.$$

The above calculations can be performed using a convolutional neural network formalism wherein the matrices representing the FDTD set of equations are sparsely populated such that the calculations can be efficiently performed using one or more tensor processing units.

The loss function, L, for an image processing device can be established in a variety of ways but generally involves defining a desired electric field distribution (or corresponding measure of electric field strength, such as intensity) at multiple wavelengths (or, correspondingly, frequencies) and comparing a simulated electric field distribution to the desired distribution at each of those wavelengths. The comparison can involve simply determining a difference at each voxel for which the desired distribution is defined or a difference of squares.

The loss function is generally defined as at least a plurality of operational wavelengths of the component. For example, in applications where the device is expected to operate at a number of discrete wavelengths of interest, the loss function can incorporate the performance of the device at each of these wavelengths. The number of wavelengths can vary as necessary. For example, some applications can include a large number of wavelengths (e.g., 20 or more wavelengths, 50 or more wavelengths, or 100 or more wavelengths) spanning a range of operational wavelengths. Alternatively, the loss function can be defined for a representative subset of the operational wavelengths. For instance, where the operational wavelengths span a range of wavelengths, the loss function can be evaluated for a finite number of discrete wavelengths spanning (e.g., evenly spanning) the operational range.

Figure 2:
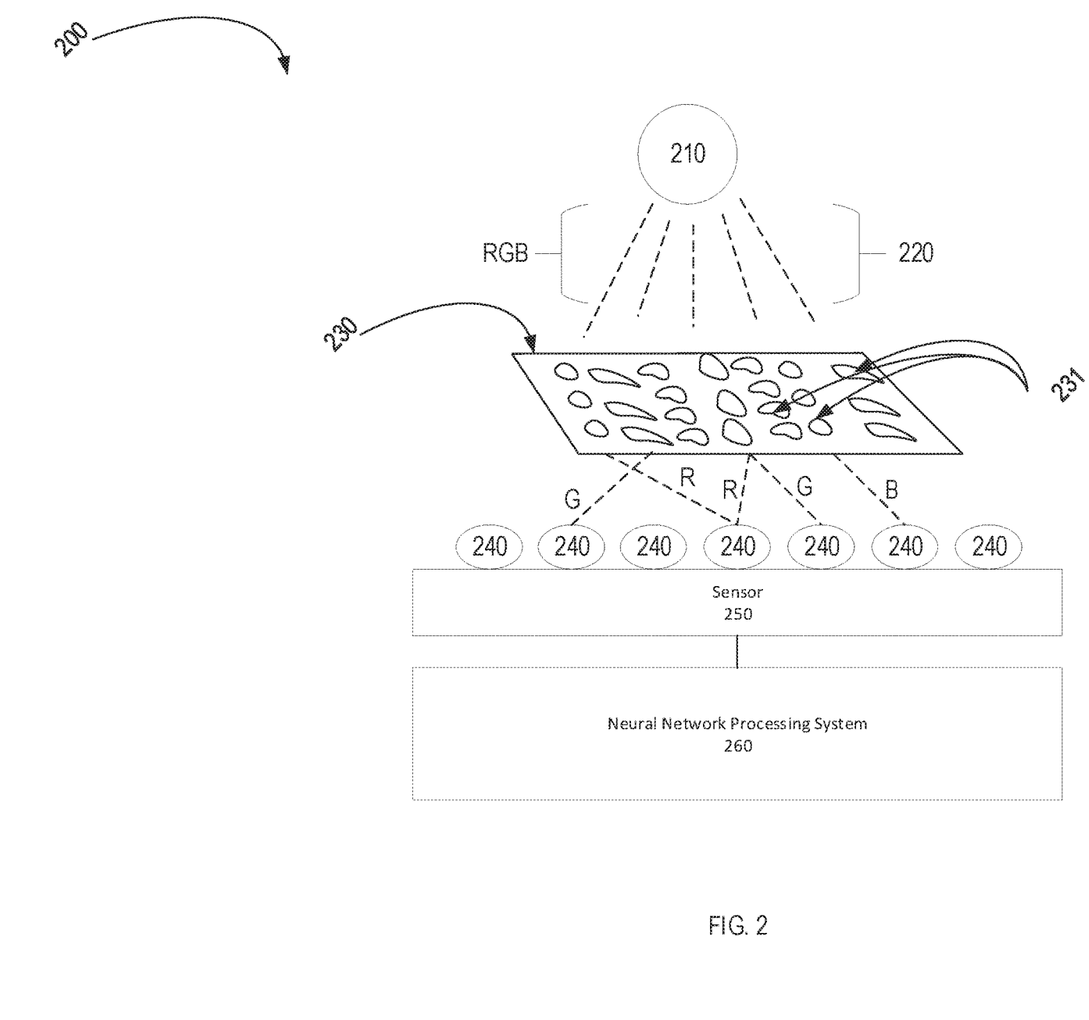
FIG. 2 shows an example of initial structure of an imaging device that includes a metasurface and an artificial neural network system.

Turning now to the example of an imaging device having a metasurface and an artificial neural network, an initial structure of an imaging device is shown in FIG. 2. The imaging device 200 includes a metasurface 230, an imaging sensor 250, and a machine learning module 260. The imaging sensor 250 includes a plurality of photo-sensors 240. The metasurface 230 includes one or more optical features 231.

The metasurface 230 includes periodic subwavelength metal and/or dielectric structures. The structures can couple to electric and/or magnetic components of incident electromagnetic fields. In some embodiments, the metasurface 230 is planar with subwavelength thickness. The metasurface 230 can be fabricated using lithography and/or nanoprinting methods. In some embodiments, at least some portion of the metasurface 230 can include sub-wavelength structures which results in a metamaterial having, in some cases, a negative index of refraction, which refers to materials having a refractive index of a negative value over some frequency range. In some embodiments, the metasurface 230 includes a substrate, such as silicon. In some embodiments, the substrate has high resistive properties. Although only one metasurface 230 is shown, in some embodiments, the imaging device 200 includes more than one metasurface 230.

The metasurface 230 includes one or more optical features 231. In some embodiments, the optical features 231 include subwavelength antennas, which can be metallic (e.g., gold) and configured to modulate incident light. In some embodiments, at least one subset of the optical features 231 is arranged to be a unit cell. A unit cell can include materials that are ordered in geometric arrangements with dimensions that can be fractions of the wavelength of light incident on the metasurface. Optical and electromagnetic properties can be engineered by changing the geometry of the unit cells. For example, by adjusting the shape, size, and configurations of unit cells, control over properties of the metasurface such as permittivity and magnetic permeability can be accomplished. When light 220 is reflected off an object 210 and illuminates the metasurface 230, the optical features 231 cooperate to cause the light 220 to separate by wavelength and direct the separated portions of light 220 towards the photo-sensors 240 of the imaging sensor 250. In some embodiments, the metasurface 230 causes light to separate by wavelength by refracting the incident light 220. In some embodiments, the optical features 231 are openings in the metasurface which are collectively configured to separate incident light by wavelength by causing the incident light 220 to diffract in accordance with wavelength. In some embodiments, the optical features 231 include curvatures configured to reflect the incident light 220 in accordance with wavelength.

The one or more photo-sensors 240 are configured to receive the wavelength separated light. Although the photo-sensors 240 are shown as a 1-dimensional array, in some embodiments, the photo-sensors 240 are arranged in a 2-dimensional N×N array. For example, the photo-sensors 240 can be arranged in a 256×256 array, a 500×500 array, a 1250×1250 array, and so forth. The photo-sensors 240 convert the received light photons into an electrical current. In some embodiments, the photo-sensors 240 include semiconductor material having a photoconductivity property in which the electrical conductance of the photo-sensors 240 vary depending on the intensity of the photons striking the semiconductor material. In some embodiments, the one or more photo-sensors 240 include at least one photodiode. Additionally, or alternatively, the one or more photo-sensors 240 include at least one bipolar phototransistor and/or photosensitive field-effect transistor. Bipolar phototransistors and photosensitive field-effect transistors can also provide amplification in addition to sensing capabilities.

In some embodiments, the imaging sensor 250 is a CCD imaging sensor. In this instance, when light is received at the photo-sensors 240, it is converted to an electrical charge and held at each of the photo-sensors 240. The CCD imaging sensor 250 includes one or more output amplifiers. The charges in the line of photo-sensors 240 nearest to the output amplifiers are amplified and output. Then each line of photo-sensors 240 shifts its charges one line closer to the amplifier, which are then amplified and output. This process continues until all lines of photo-sensors 240 have had their charge amplified and output. In some embodiments, the imaging sensor 250 is a CMOS sensor, in which each photo-sensor 240 has a corresponding amplifier. In some embodiments, the imaging sensor 250 includes an analog-to-digital converter (ADC) to convert the analog electrical signal into a digital signal (e.g., a discrete time signals). For example, the imaging sensor 250 can include direct-conversion ADCs, successive-approximation ADCs, ramp-compare ADCs, pipelined ADCs, and/or sigma-delta ADCs. In some embodiments, the imaging sensor 250 includes one or more amplifiers for amplifying the electrical current generated by the photo-sensors 240. In some embodiments, the one or more amplifiers of the imaging sensor are integrated with the photo-sensors 240.

The neural network processing system 260 is communicatively coupled to the imaging sensor 250 and is configured to receive data about the incident light from the imaging sensor 250. The neural network processing system 260 includes one or more special-purpose integrated circuits for performing neural network computations. In some embodiments, the neural network processing system 260 includes a convolutional neural network (CNN). A convolutional neural network (CNN) can be configured based on a presumption that inputs to the neural network correspond to image pixel data for an image or other data that includes features at multiple spatial locations. For example, sets of inputs can form a multi-dimensional data structure, such as a tensor, that represent color features of an example digital image (e.g., an image of the surroundings of a vehicle). In some implementations, inputs to the neural network correspond to a variety of other types of data, such as data obtained from different devices and sensors of a vehicle, point cloud data, audio data that includes certain features or raw audio at each of multiple time steps, or various types of one-dimensional or multiple dimensional data. A convolutional layer of the convolutional neural network can process the inputs to transform features of the image that are represented by inputs of the data structure. For example, the inputs are processed by performing dot product operations using input data along a given dimension of the data structure and a set of parameters for the convolutional layer.

Performing computations for a convolutional layer can include applying one or more sets of kernels to portions of inputs in the data structure. The manner in which a system performs the computations can be based on specific properties for each layer of an example multi-layer neural network or deep neural network that supports deep neural net workloads. A deep neural network can include one or more convolutional towers (or networks) along with other computational layers. In particular, for example computer vision applications, these convolutional towers often account for a large proportion of the inference calculations that are performed. Convolutional layers of a CNN can have sets of artificial neurons that are arranged in three dimensions, a width dimension, a height dimension, and a depth dimension. The depth dimension corresponds to a third dimension of an input or activation volume and can represent respective color channels of an image. For example, input images can form an input volume of data (e.g., activations), and the volume has dimensions 32×32×3 (width, height, depth respectively). A depth dimension of 3 can correspond to the RGB color channels of red (R), green (G), and blue (B).

In general, layers of a CNN are configured to transform the three dimensional input volume (inputs) to a multi-dimensional output volume of neuron activations (activations). For example, a 3D input structure of 32×32×3 holds the raw pixel values of an example image, in this case an image of width 32, height 32, and with three color channels, R,G,B. A convolutional layer of a neural network of the neural network processing system 260 computes the output of neurons that may be connected to local regions in the input volume. Each neuron in the convolutional layer can be connected only to a local region in the input volume spatially, but to the full depth (e.g., all color channels) of the input volume. For a set of neurons at the convolutional layer, the layer computes a dot product between the parameters (weights) for the neurons and a certain region in the input volume to which the neurons are connected. This computation may result in a volume such as 32×32×12, where 12 corresponds to a number of kernels that are used for the computation. A neuron's connection to inputs of a region can have a spatial extent along the depth axis that is equal to the depth of the input volume. The spatial extent corresponds to spatial dimensions (e.g., x and y dimensions) of a kernel.

A set of kernels can have spatial characteristics that include a width and a height and that extends through a depth of the input volume. Each set of kernels for the layer is applied to one or more sets of inputs provided to the layer. That is, for each kernel or set of kernels, the neural network processing system 260 can overlay the kernel, which can be represented multi-dimensionally, over a first portion of layer inputs (e.g., that form an input volume or input tensor), which can be represented multi-dimensionally. For example, a set of kernels for a first layer of a CNN may have size 5×5×3×16, corresponding to a width of 5 pixels, a height of 5 pixel, a depth of 3 that corresponds to the color channels of the input volume to which to a kernel is being applied, and an output dimension of 16 that corresponds to a number of output channels. In this context, the set of kernels includes 16 kernels so that an output of the convolution has a depth dimension of 16.

The system 260 can then compute a dot product from the overlapped elements. For example, the neural network processing system 260 can convolve (or slide) each kernel across the width and height of the input volume and compute dot products between the entries of the kernel and inputs for a position or region of the image. Each output value in a convolution output is the result of a dot product between a kernel and some set of inputs from an example input tensor. The dot product can result in a convolution output that corresponds to a single layer input, e.g., an activation element that has an upper-left position in the overlapped multi-dimensional space. As discussed above, a neuron of a convolutional layer can be connected to a region of the input volume that includes multiple inputs. The neural network processing system 260 can convolve each kernel over each input of an input volume. The neural network processing system 260 performs this convolution operation by, for example, moving (or sliding) each kernel over each input in the region.

The system 260 moves each kernel over inputs of the region based on a stride value for a given convolutional layer. For example, when the stride is set to 1, then the system 260 moves the kernels over the region one pixel (or input) at a time. Likewise, when the stride is 2, then the neural network processing system 260 moves the kernels over the region two pixels at a time. Thus, kernels may be shifted based on a stride value for a layer and the neural network processing system 260 can repeatedly perform this process until inputs for the region have a corresponding dot product. Related to the stride value is a skip value. The skip value can identify one or more sets of inputs (2×2), in a region of the input volume, that are skipped when inputs are loaded for processing at a neural network layer. In some implementations, an input volume of pixels for an image can be "padded" with zeros, e.g., around a border region of an image. This zero-padding is used to control the spatial size of the output volumes.

As discussed previously, a convolutional layer of CNN is configured to transform a three dimensional input volume (inputs of the region) to a multi-dimensional output volume of neuron activations. For example, as the kernel is convolved over the width and height of the input volume, system 260 produces a multi-dimensional activation map that includes results of convolving the kernel at one or more spatial positions based on the stride value. In some cases, increasing the stride value produces smaller output volumes of activations spatially. In some implementations, an activation can be applied to outputs of the convolution before the outputs are sent to a subsequent layer of the neural network.

An example convolutional layer can have one or more control parameters for the layer that represent properties of the layer. For example, the control parameters can include a number of kernels, K, the spatial extent of the kernels, F, the stride (or skip), S, and the amount of zero padding, P. Numerical values for these parameters, the inputs to the layer, and the parameter values of the kernel for the layer shape the computations that occur at the layer and the size of the output volume for the layer. In one implementation, the spatial size of the output volume is computed as a function of the input volume size, W, using the formula $(W-F+2P)/S+1$. For example, an input tensor can represent a pixel input volume of size [227×227×3]. A convolutional layer of a neural network can have a spatial extent value of $F=11$, a stride value of $S=4$, and no zero-padding ($P=0$). Using the above formula and a layer kernel quantity of $K=96$, the neural network processing system 260 performs computations for the layer that results in a convolutional layer output volume of size [55×55×96], where 55 is obtained from $[(227-11+0)/4+1=55]$.

The computations (e.g., dot product computations) for a convolutional layer, or other layers, of a neural network involve performing mathematical operations, e.g., multiplication and addition, using a computation unit of a hardware circuit of the neural network processing system 260. The design of a hardware circuit can cause a system to be limited in its ability to fully utilize computing cells of the circuit when performing computations for layers of a neural network.

Based on the aforementioned techniques, the system 260 is configured to perform one or more digital image processes to enhance/restore the resolution of the output image data received from the imaging sensor 250. In some embodiments, the system 260 is configured to perform one or more demosaicing algorithms, such as interpolation techniques (e.g., nearest-neighbor, bilinear, etc.), spatial correlation techniques (e.g., variable number of gradients, pixel groupings, etc.), and so forth. Although the metasurface 230 can offer efficiency advantages with respect to the amount of photons captured when compared to traditional color filter arrays, the ability to engineer the metasurface 230 to cause the light to reflect precisely may have some limitations, and thus the demosaicing algorithm may still be important for image enhancement/restoration. Additionally, or alternatively, the system 260 can be configured to perform super-resolution techniques, in which the system 260 is trained to enhance an image using a per-pixel loss between an output of the system 260 and ground-truth images. Because the electronic components of the imaging sensor 250 can induce noise and blurring into the imaging data while the imaging sensor 250 processes the light information, performing super-resolution can be an important part of enhancing/restoring the received image data. These super-resolution techniques can include denoising and deblurring.

Figure 3:
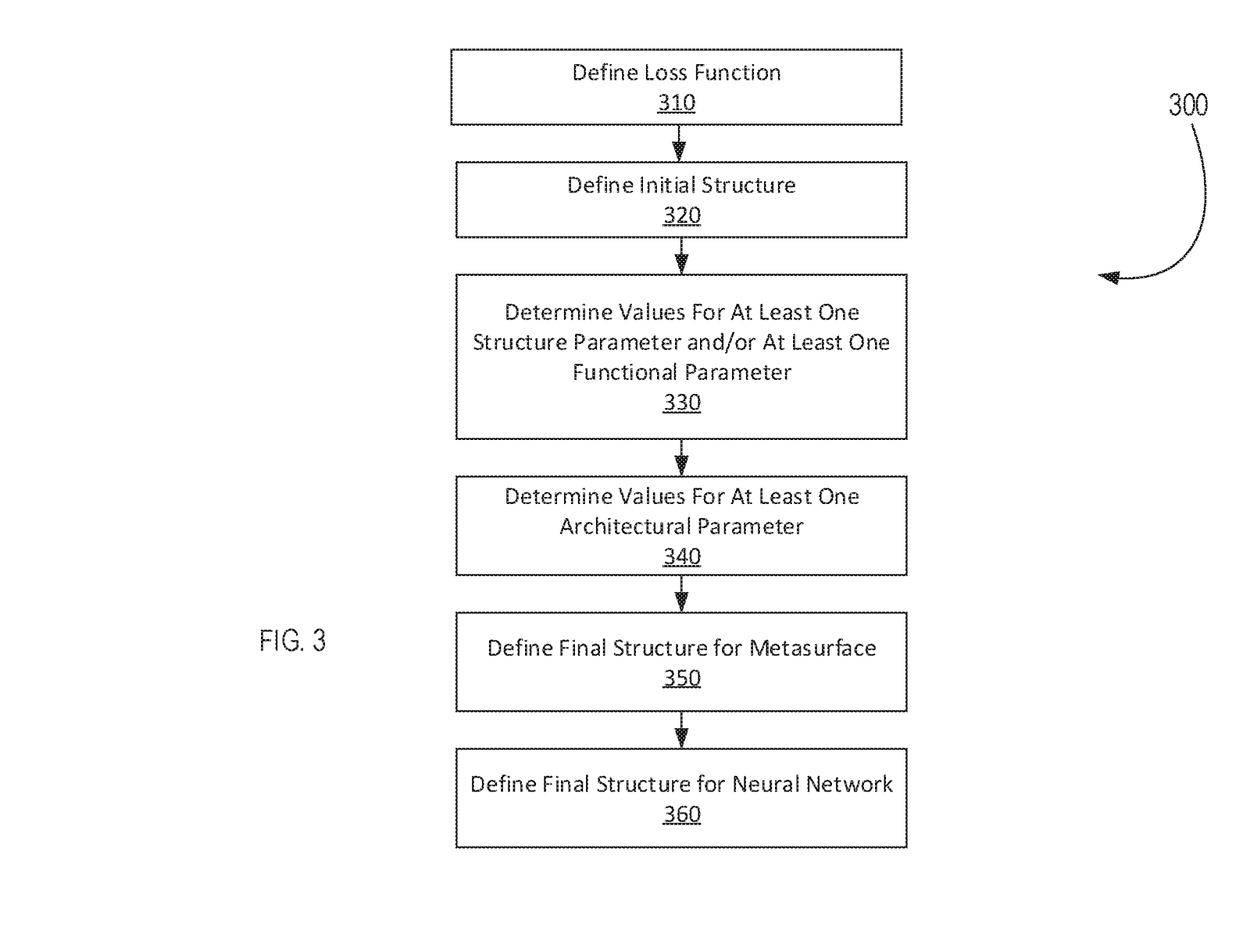
FIG. 3 depicts a flowchart showing a method for designing an imaging device having a metasurface and an artificial neural network system, according to one or more embodiments of the present disclosure.

FIG. 3 depicts a flowchart showing a method 300 for designing an imaging device. The imaging device can be similar to the imaging device 200 of FIG. 2 in that it can include one or more optical interfaces (e.g., metasurfaces with optical features, photo-sensors, etc.) and one or more neural network processing systems. The method includes defining a loss function (block 310), defining an initial structure (block 320), determining values for at least one structural parameter and/or at least one functional parameter (block 330), determining values for at least one architectural parameter (block 340), defining a final structure for a metasurface (block 350) and defining a final structure for a neural network (block 360).

At block 310, a loss function is defined within a simulation space encompassing the imaging device. In some implementations, the loss function corresponds to an output of the neural network processing system resulting from an interaction between an input electromagnetic field having an operative wavelength within the imaging device and the one or more optical interfaces of the imaging device. In some embodiments, an optical interface includes a metasurface and/or each optical feature of a metasurface. In some embodiments, an optical interface includes a photo-sensor of a photo-sensor array and/or an electronic component of an imaging sensor (e.g., ADC, amplifiers, etc.) The input electromagnetic field can be the initial light illuminated on the metasurface of the imaging device, as described above with reference to FIG. 2.

In some implementations, the loss function is based on a target pixel loss value. For example, the loss function can be based on the amount of each color missing from the output of the neural network processing system when compared to the initial light incident on the metasurface. Additionally, or alternatively, the loss function can be based on a signal-to-noise ratio of an output of the neural network processing system. In some implementations, the loss function can account for manufacturing cost, feasibility, and/or materials available. For example, it may not be feasible to design some of the optical interfaces of the optical device with more than one material. It may not be feasible for the optical interfaces to include curvatures less than a certain size. Due to budget considerations, it may not be feasible to make the optical interfaces out of extraordinarily expensive materials. The loss function can account for these considerations and treat them as penalties.

At block 320, an initial structure for each of the one or more optical interfaces is defined, as well as an initial structure of the architecture for the neural network processing system. The initial structures can be defined to include one or more optical features, one or more photo-sensors, a type of photo-sensor, and the type of neural network used with the imaging device (e.g., recurrent, CNN, etc.). For example, the initial structure can be the imaging device 200 discussed earlier with reference to FIG. 2. In some implementations, each physical component of the initial structure can be separated into a plurality of voxels (e.g., the metasurface, photo-sensor array, and imaging sensor). In some implementations, the computational inverse design tool 100 of FIG. 1A separates the structures into voxels. In some implementations, at least some of the voxels have a dimension smaller than an operative wavelength of the optical device (e.g., $0.5\lambda$ or less, $0.2\lambda$ or less, $0.1\lambda$ or less, $0.05\lambda$ or less). The dimensions of the voxels can be selected based on, for example, manufacturing tolerances, minimum feature size that a given process can allow, or both.

At block 330, values are determined for at least one structural parameter and/or at least one functional parameter of the one or more optical interfaces of the optical device. For example, values can be determined for a refractive index at each voxel of an optical interface (i.e., structural parameter). Determined values can be associated with a type, thickness, composition, and/or shape of an optical feature of a metasurface (e.g., holes, curvatures, antennas, etc). In some implementations, the determined values are associated with the thickness, composition, and/or shape of the one or more metasurfaces of the initial structure. As another example, a refractive index (i.e., functional parameter) can be determined for the one or more optical interfaces, such as the optical features of the metasurface. Examples of other functional parameters that can be determined include: values associated with the angle of diffraction of each optical interface, values associated with the amount of reflectivity of each optical interface, values associated with permittivity, values associated with transmissivity, and values associated with magnetic permeability. The values are determined by solving Maxwell's equations to optimize the loss function in accordance with the initially defined structure. For example, the values can be determined such that a loss (e.g., as defined in terms of signal-to-noise ratio and/or pixel loss value), in accordance with the defined loss function, is within a target loss threshold. Thus, values of the structural and functional parameters of the optical interfaces of the imaging device can be determined in such a manner that loss is minimized (or maximized). In some implementations, the Maxwell's equations are solved using a finite-difference time domain solver. In some implementations, the finite-difference time domain solver includes the computational inverse design tool 100 described earlier with reference to FIG. 1A.

At block 340, values are determined for at least one architectural parameter of the neural network processing system of the imaging device. For example, for each iterative change of the optical interfaces during the simulation process, values associated with the inference accuracy of each neural network layer, computational speed of each layer, and/or demosaicing algorithm at each layer can be determined. Thus, for each iterative change in the optical interfaces, the neural network processing system can also be optimized for performing its image enhancement/restoration functions.

At block 350, a final structure for the one or more optical interfaces is defined based on the determined values of the structural and/or functional parameters. For example, based on the determined values, the material composition at each optical interface can be determined. As another example, the amount and type of ADCs used in the imaging sensor can be determined based on the determined values. Examples of final structures that can be determined also include the type of material to use for the metasurface, the number of optical features to include on the metasurface, the shape of each optical feature on the metasurface, the type of photo-sensor to use for each photo-sensor of the imaging sensor, the type of substrate to use for the imaging sensor, and so forth.

At block 360, a final architectural structure for the neural network processing system is defined based on the determined architectural parameters. For example, the values of weights and biases at each layer of the neural network can be defined based on the determined values. Additionally, or alternatively, the number of layers, type of layers, size of kernels at each layer, size of stride at each layer, and/or other features defining the topology of the neural network can be determined for the neural network. In some embodiments, the type of demosaicing algorithm and/or other image enhancement/restoration techniques used by the system can be defined based on the determined values. Thus, in some implementations, the architecture of the neural network processing system is defined to minimize loss (e.g., as defined in terms of pixel loss value and/or signal-to-noise ratio) associated with the output of the neural network based on the final structure of the metasurface and the imaging sensor.

In some aspects, implementations described in the present disclosure may rely on machine learning engines and machine learning algorithms to perform generative design tasks. Generative design may, in some aspects, mimic an evolutionary problem-solving process, which uses inputs such as design goals, computes hundreds (if not thousands or millions) of potential solutions, and selects one or more best solutions from the multitude of solution permutations. Indeed, in some aspects, machine learning engines applied to a generative design process may generate or process thousands, or even millions, of design choices, test configurations and learn from each iterative solution. Thus, aspects of the described implementations may use the machine learning engines in a generative design process to generate unique and bespoke solutions beyond those that a human being, alone, could create to arrive at the best design solution. In some aspects, the machine learning engines and algorithms of the generative design process may rely on algorithmic and parametric modeling within a process that includes a design schema, one or more machine learning engines configured to create variations, and one or more machine learning engines configured to select desirable outcomes.

Figure 4:
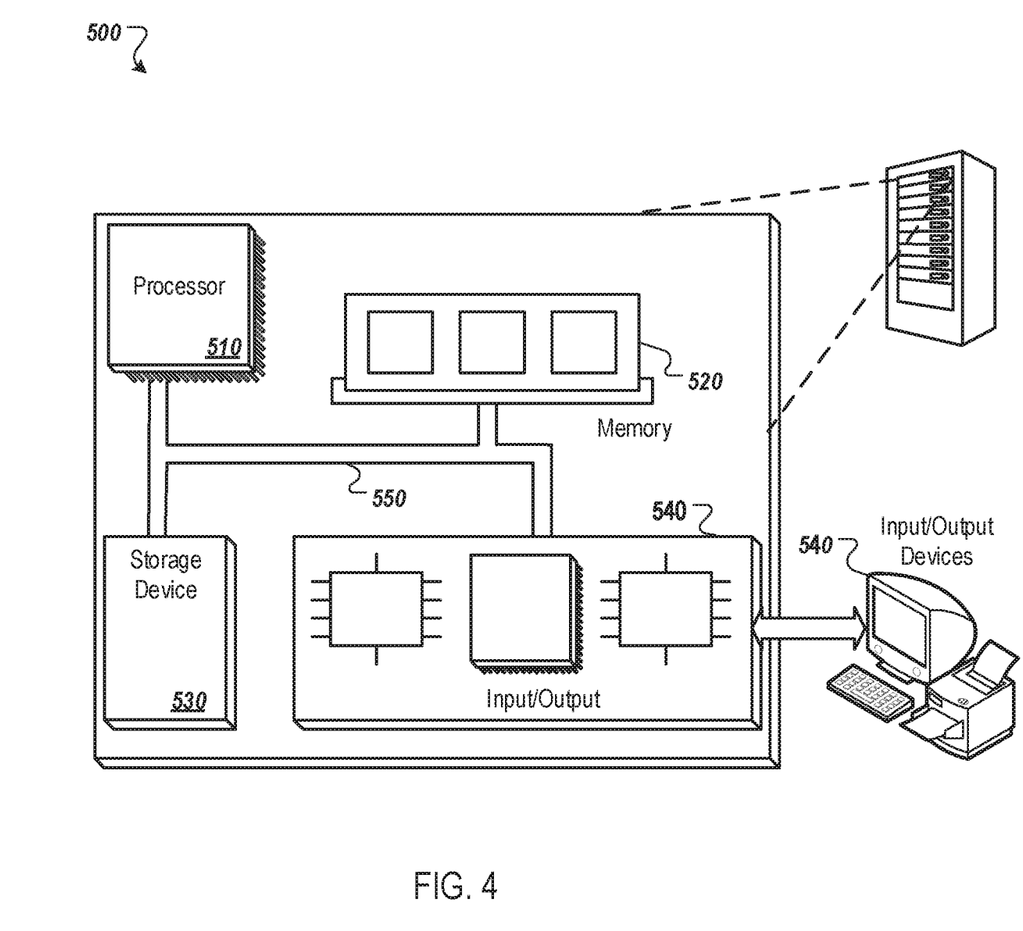
FIG. 4 is a schematic diagram of an example computer system, according to one or more embodiments of the present disclosure.

FIG. 4 is a schematic diagram of an example computer system 500. The system 500 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification (e.g., machine learning engine(s)) and their structural equivalents, or in combinations of one or more of them. The system 500 is intended to include various forms of digital computers, such as laptops, desktops, workstations, personal digital assistants, servers, blade servers, mainframes, and other appropriate computers, including vehicles installed on base units or pod units of modular vehicles. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer-implemented method for designing an image processing device comprising at least one metasurface having one or more physical features and a neural network having one or more architecture features configured to perform image reconstruction, the method comprising:
    defining a loss function within a simulation space composed of a plurality of voxels, the simulation space encompassing the one or more features of the metasurface and the one or more architecture features of the neural network, the loss function corresponding to at least one image quality metric resulting from:
        an interaction between an input electromagnetic field at an operative wavelength of the image processing device and the one or more physical features of the metasurface; and
        processing, by the neural network, the result of the interaction between the input electromagnetic field and the one or more features of the metasurface;
    defining an initial structure for the one or more physical features of the metasurface and the one or more architectural features of the neural network in the simulation space, at least some of the voxels corresponding to each of the one or more physical features and having a dimension smaller than the operative wavelength;
    determining, using a computer system, values for at least one structural parameter, and/or at least one functional parameter for the one or more physical features and at least one architectural parameter for the one or more architectural features, using a numerical solver to solve Maxwell's equations so that a loss determined according to the loss function is within a threshold loss, wherein the at least one structural and/or functional parameter correspond to a structure of the metasurface and wherein the at least one architectural parameter corresponds to a structure of the neural network;
    defining a final structure of the metasurface based on the values for the one or more structural parameters; and
    defining a final structure of the neural network based on the values for the at least one architectural parameter.

2. The method of claim 1, wherein the physical features include at least one of: a nanostructure, a curvature, a hole, or an antenna.

3. The method of claim 1, wherein the neural network includes one or more architecture features configured to perform demosaicing.

4. The method of claim 1, wherein the one or more architecture features include at least one of: a weight or a bias.

5. The method of claim 1, wherein the at least one image quality metric includes at least one of: a signal-to-noise ratio, an amount of blur, a pixel loss value, or a resolution value.

6. The method of claim 1, wherein the loss function corresponding to at least one image quality metric is further resulting from converting the result of the interaction between the input electromagnetic field and the one or more features of the metasurface.

7. The method of claim 1, wherein the at least one structural parameter includes at least one of: a curvature angle, a curvature size, or a size of an opening.

8. The method of claim 1, wherein the at least one functional parameter includes at least one of: a refractive index, a reflection angle, a diffraction angle, or a transmissivity value.

9. The method of claim 1, wherein the at least one architectural parameter includes at least one of an accuracy value, a layer type, or a demosaicing type.

10. The method of claim 1, wherein the numerical solver comprises a finite-difference time domain solver.

11. A system for designing an image processing device comprising at least one metasurface having one or more physical features and a neural network having one or more architecture features configured to perform image reconstruction, comprising:
one or more processors; and
computer storage storing executable computer instructions in which, when executed by the one or more processors, cause the one or more processors to perform operations comprising:
defining a loss function within a simulation space composed of a plurality of voxels, the simulation space encompassing the one or more features of the metasurface and the one or more architecture features of the neural network, the loss function corresponding to at least one image quality metric resulting from:
an interaction between an input electromagnetic field at an operative wavelength of the image processing device and the one or more physical features of the metasurface; and
processing, by the neural network, the result of the interaction between the input electromagnetic field and the one or more features of the metasurface;
defining an initial structure for the one or more physical features of the metasurface and the one or more architectural features of the neural network in the simulation space, at least some of the voxels corresponding to each of the one or more physical features and having a dimension smaller than the operative wavelength;
determining, using a computer system, values for at least one structural parameter, and/or at least one functional parameter for the one or more physical features and at least one architectural parameter for the one or more architectural features, using a numerical solver to solve Maxwell's equations so that a loss determined according to the loss function is within a threshold loss, wherein the at least one structural and/or functional parameter correspond to a structure of the metasurface and wherein the at least one architectural parameter corresponds to a structure of the neural network;
defining a final structure of the metasurface based on the values for the one or more structural parameters; and
defining a final structure of the neural network based on the values for the at least one architectural parameter.

12. The system of claim 11, wherein the physical features include at least one of: a nanostructure, a curvature, a hole, or an antenna.

13. The system of claim 11, wherein the neural network includes one or more architecture features configured to perform demosaicing.

14. The system of claim 11, wherein the one or more architecture features include at least one of: a weight or a bias.

15. The system of claim 11, wherein the at least one image quality metric includes at least one of: a signal-to-noise ratio, an amount of blur, a pixel loss value, or a resolution value.

16. The system of claim 11, wherein the loss function corresponding to at least one image quality metric is further resulting from converting the result of the interaction between the input electromagnetic field and the one or more features of the metasurface.

17. The system of claim 11, wherein the at least one structural parameter includes at least one of: a curvature angle, a curvature size, or a size of an opening.

18. The system of claim 11, wherein the at least one functional parameter includes at least one of: a refractive index, a reflection angle, a diffraction angle, or a transmissivity value.

19. The system of claim 11, wherein the at least one architectural parameter includes at least one of an accuracy value, a layer type, or a demosaicing type.

20. The system of claim 11, wherein the numerical solver comprises a finite-difference time domain solver.

* * * * *